United States Patent
Buck

(10) Patent No.: US 6,380,782 B2
(45) Date of Patent: Apr. 30, 2002

(54) INTEGRATED CIRCUIT

(75) Inventor: Martin Buck, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/756,525

(22) Filed: Jan. 8, 2001

Related U.S. Application Data

(63) Continuation of application No. PCT/DE99/01904, filed on Jul. 1, 1999.

(30) Foreign Application Priority Data

Jul. 8, 1998 (DE) .......................... 198 30 571

(51) Int. Cl.⁷ ............................................. H03H 11/16
(52) U.S. Cl. ...................... 327/233; 327/234; 327/244; 365/189.07; 365/194
(58) Field of Search .............................. 327/233, 234, 327/236, 237, 244, 155, 156, 158, 277; 365/194, 201, 233, 189.07, 189.08

(56) References Cited

U.S. PATENT DOCUMENTS

| | | | |
|---|---|---|---|
| 5,223,755 A | 6/1993 | Richley | 331/1 A |
| 5,539,344 A | 7/1996 | Hatakenaka | 327/147 |
| 5,550,783 A | 8/1996 | Stephens, Jr. et al. | 365/233 |
| 5,684,421 A | 11/1997 | Chapman et al. | 327/261 |

FOREIGN PATENT DOCUMENTS

GB     2 316 208 A     2/1998

OTHER PUBLICATIONS

C. Kim et al.: "A 640MB/s Bi–Directional Data Strobed, Double–Data–Rate SDRAM with a 40mW DLL Circuit for a 256 MB Memory System", ISSCC98 / session 10 / High–Speed Chip–To–Chip Connections / Paper FA 10.2.

*Primary Examiner*—Kenneth B. Wells
*Assistant Examiner*—An T. Luu
(74) *Attorney, Agent, or Firm*—Herbert L. Lerner; Laurence A. Greenberg; Werner H. Stemer

(57) ABSTRACT

The integrated circuit has a clock input for an external clock signal and an output unit controlled by an internal clock signal in a normal mode of operation to output data to a data output. In addition, the integrated circuit has a control unit generating the internal clock signal from the external clock signal. The control unit has a phase shift unit that, in the normal mode of operation, effects a phase shift of the internal clock signal generated by the control unit with respect to the external clock signal. In addition, the integrated circuit has a detector unit determining the capacitive load on the data output. The detector unit supplying the phase shift unit with a corresponding detector signal on the basis of which the phase shift is set.

3 Claims, 3 Drawing Sheets

INTEGRATED CIRCUIT

CROSS-REFERENCE TO RELATED APPLICATION:

This application is a continuation of copending International Application No. PCT/DE99/01904, filed Jul. 1, 1999, which designated the United States.

BACKGROUND OF THE INVENTION

Field of the Invention

The invention relates to an integrated circuit having a clock input for an external clock signal. The integrated circuit also has an output unit. The output unit is controlled by an internal clock signal and outputs data to a data output. The integrated circuit also has a control unit to generate the internal clock signal from the external clock signal. The control unit has a phase shift unit that effects a phase shift of the internal clock signal generated by the control unit with respect to the external clock signal.

An integrated circuit of this type in the form of an SDRAM (synchronous DRAM) is described in C. Kim et al.: "A 640 MB/s Bi-Directional Data Strobed, Double-Data-Rate SDRAM with a 40 mW DLL Circuit for a 256 MB Memory System", in ISSCC98/Session10/High-Speed Chip-To-Chip Connections/Paper FA 10.2. The output unit of the SDRAM is clocked with the internal clock signal which, as compared with the external clock signal, has a negative phase shift, which is generated by the control unit in the form of a DLL circuit (delay locked loop). The negative phase shift effected by the DLL makes the internal clock signal lead with respect to the external clock signal. The negative phase shift effected by the DLL is set in such a way that, taking account of the signal propagation time between the output unit and the data output, data output by the output unit are present at the data output with essentially the same phase as the external clock signal. In this way, the data output externally at the data output is in turn synchronized with the external clock signal. GB-A-2 316 208 describes a semiconductor circuit having a digital delay circuit. The latter contains a control unit for generating a timing signal from an externally supplied clock signal. The control unit has a delay circuit to generate the timing signal. A comparison circuit compares the phase angle of an output signal with the phase angle of a reference signal. From this comparison, a control unit sets the delay in the delay circuit.

In U.S. Pat. No. 5,550,783, Stephens, Jr. et al. describe a circuit for correcting a phase shift for a monolithic RAM memory. This has a phase correction circuit that is used to generate an internal clock signal. The phase correction circuit has a comparator circuit. An external clock signal and an internal clock signal are supplied to the comparator circuit. The external clock signal and the internal clock signal are delayed with respect to the comparator. From these two signals, a control signal is derived for the purpose of appropriate adjustment of the delay of the internal clock signal.

SUMMARY OF THE INVENTION

It is accordingly an object of the invention to provide an integrated circuit that overcomes the hereinafore-mentioned disadvantages of the heretofore-known devices of this general type and, in which, data is output at the data output with improved synchronism in relation to the external clock signal, irrespective of the external wiring of the circuit.

With the foregoing and other objects in view, there is provided, in accordance with the invention, an integrated circuit. The integrated circuit includes a clock input for an external clock signal. The clock input has a clock output unit controlled by an internal clock signal. The clock output unit outputs data to a data output during a normal mode of operation.

The integrated circuit also includes a control unit. The control unit generates the internal clock signal from the external clock signal. The internal clock signal has a specific phase shift with respect to the external clock signal. The control unit includes an adjustable phase shift unit outputting a phase shift unit output signal. The adjustable phase shift unit sets the specific phase shift of the phase shift unit output signal during a test mode of operation. A detector unit has a detector output unit and a comparison unit. The detector unit determines a capacitive load on a data output in the test mode of operation and supplies the phase shift unit with a corresponding detector signal with which the phase shift unit sets the specific phase shift. The detector output unit outputs a test signal to the data output in the test mode of operation. The comparison unit has a first comparison unit input and a second comparison unit input determining a phase shift between the external clock signal and the test signal established at the data output in the test mode of operation.

The integrated circuit also includes a first input driver. The first input driver has a first input driver input and a first input driver output. The first input driver supplies the external clock signal. The first input driver input connects to the clock input and the first input driver output connecting to the first comparison unit input of the comparison unit and to a clock input of the output unit. The first input driver forms a propagation time of the external clock signal through the first input driver.

The integrated circuit also includes a second input driver. The second input driver has a second input driver input and a second input driver output. The second input driver input is supplied with the test signal established at the data output in the test mode of operation. The second input driver output connects to the second comparison unit input of the comparison unit. The second input driver defines a propagation time of the test signal through the second input driver. The second input driver supplies data to be applied externally to the integrated circuit during the normal mode of operation.

In the integrated circuit, the propagation time of the external clock signal through the first input driver and the propagation time of the test signal through the second input driver are essentially identical.

In accordance with another feature of the invention, the output unit is controlled by the external clock signal in the test mode of operation. In addition, the control unit sets the phase shift unit so that the specific phase shift essentially equals the phase shift determined by the comparison unit.

In accordance with another feature of the invention, the integrated circuit includes a voltage controlled delay element and a phase detector unit. The voltage controlled delay element generates the internal clock signal from the external clock signal. The phase detector unit controls the voltage controlled delay element having a first phase detector unit input and a second phase detector unit input. The first phase detector unit input receives the external clock signal. The second phase detector unit input receives an output signal from the phase shift unit. The phase shift unit receives the internal clock signal. The phase shift unit effects a phase shift in the phase shift unit output signal with respect to the internal clock signal based on the detector signal.

The integrated circuit according to the invention has a clock input for an external clock signal and an output unit.

The clock input is controlled by an internal clock signal in a normal mode of operation. The clock input outputs data to a data output. In addition, the integrated circuit has a control unit generating the internal clock signal from the external clock signal. The control unit has an adjustable phase shift unit with which the specific phase shift can be set in a test mode of operation. The control unit also has a detector unit to determine the capacitive load on the data output in the test mode of operation. The unit supplies the phase shift unit with a corresponding detector signal on the basis of which the desired value of the phase shift is set.

The SDRAM described by Kim et al. in the aforementioned article has the disadvantage that the negative phase shift, effected by the DLL, of the internal with respect to the external clock signal leads to the desired result only for specific connections to the data output. This is because, in the invention explained below, the inventor has determined that, depending on the connection of the data output, its capacitive load can vary sharply. Since the signal propagation time between the output unit and the data output depends on the capacitive load of the data output, the negative phase shift effected by the DLL is permanently set by the manufacturer of the SDRAM in the case of known circuits, however, the data output at the data output are in many cases not synchronized with the external clock signal.

Because the phase shift is set by the phase shift unit in accordance with the determined capacitive load on the data output, the internal clock signal has a chronological relationship with the external clock signal. In these relationship, the data output by the output unit at the data output is synchronized with the external clock signal. This synchronization is achieved irrespective of the connections to the data output, which are responsible for the capacitive load of the latter. In contrast to the prior art explained in the introduction of the description, the invention controls the phase shift with the control unit, which can be a DLL, for example, that is not already permanently set by the manufacturer of the integrated circuit. Instead, the control unit itself sets its phase shift by detecting the capacitive load at the data output during operation: i.e., after the external connection of the integrated circuit has been completed.

The invention is suitable for use in SDRAMs. However, the invention's use is also possible in any other desired integrated circuits that supply data at a data output, these data outputs to be synchronized with an external clock signal.

According to a development of the invention, a test mode of operation of the integrated circuit is provided. In the test mode, the output unit outputs a test signal at the data output. Then, the detector unit determines the propagation time of the test signal from the output unit to the data output as a measure of the capacitive load on the data output. This permits the capacitive load on the data output to be determined in a simple way.

According to a development of the invention, the propagation time of the test signal is determined by the output unit being controlled by the external clock signal in the test mode of operation. The detector unit also has a comparison unit for determining the phase shift between the external clock signal and the test signal that is established at the data output in the test mode of operation. The control unit sets the phase shift with the phase shift unit in such a way that the set phase shift essentially agrees with the phase shift determined by the comparison unit.

As opposed to the normal mode of operation, in the test mode of operation, the output unit is not controlled by the internal clock signal but rather by the external clock signal. Because the external clock signal is predefined externally, the result is in this way a defined starting time for the output of the test signal by the output unit in the test mode of operation. The propagation time of the test signal from the output unit to the data output therefore can be determined without difficulty because the monitoring is carried out to see how much later the test signal at the data output has an edge than the external clock signal that initiates the output of the test signal by the output unit.

The adjustment of the phase shift in accordance with the invention by the phase shift unit, and the associated determination of the capacitive load on the data output, in the case of the integrated circuit, can be performed, for example, during an initiation operation during its commissioning.

In accordance with a development, the integrated circuit has a first input driver to supply the external clock signal. The input of the driver is connected to the clock input and its output is connected to a first input of the comparison unit and to a clock input of the output unit. In addition, the integrated circuit has a second input driver whose input is supplied with the test signal that is established at the data output in the test mode of operation. The second input driver has an output connected to a second input of the comparison unit. In this case, the propagation time of the external clock signal through the first input driver is essentially equal to the propagation time of the test signal through the second input driver.

In the test mode of operation, because the comparison unit determines the phase shift between the external clock signal and the test signal output at the data output, falsification of the comparison result on the basis of different dimensioning of the two input drivers is avoided. This falsification would otherwise result from the comparison unit. In the test mode of operation, the comparison unit determines the phase shift between the external clock signal and the test signal on the data output. This means that the comparison unit is supplied with the two signals via the aforementioned two input drivers rather than directly. If the propagation times through the two input drivers were different, the comparison unit would determine a phase shift that is caused at least partially by this propagation-time difference.

According to a development of the invention, in the normal mode, the second input driver supplies data externally to the integrated circuit. The second input driver is used both in the test mode of operation, in which the second input driver transmits the test signal from the data output to the comparison unit, and in the normal mode of operation, in which the second input driver transmits data to the interior of the integrated circuit. Furthermore, two different input drivers are not needed for these two chronologically separated tasks. This reduces the area requirement.

Other features which are considered as characteristic for the invention are set forth in the appended claims.

Although the invention is illustrated and described herein as embodied in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
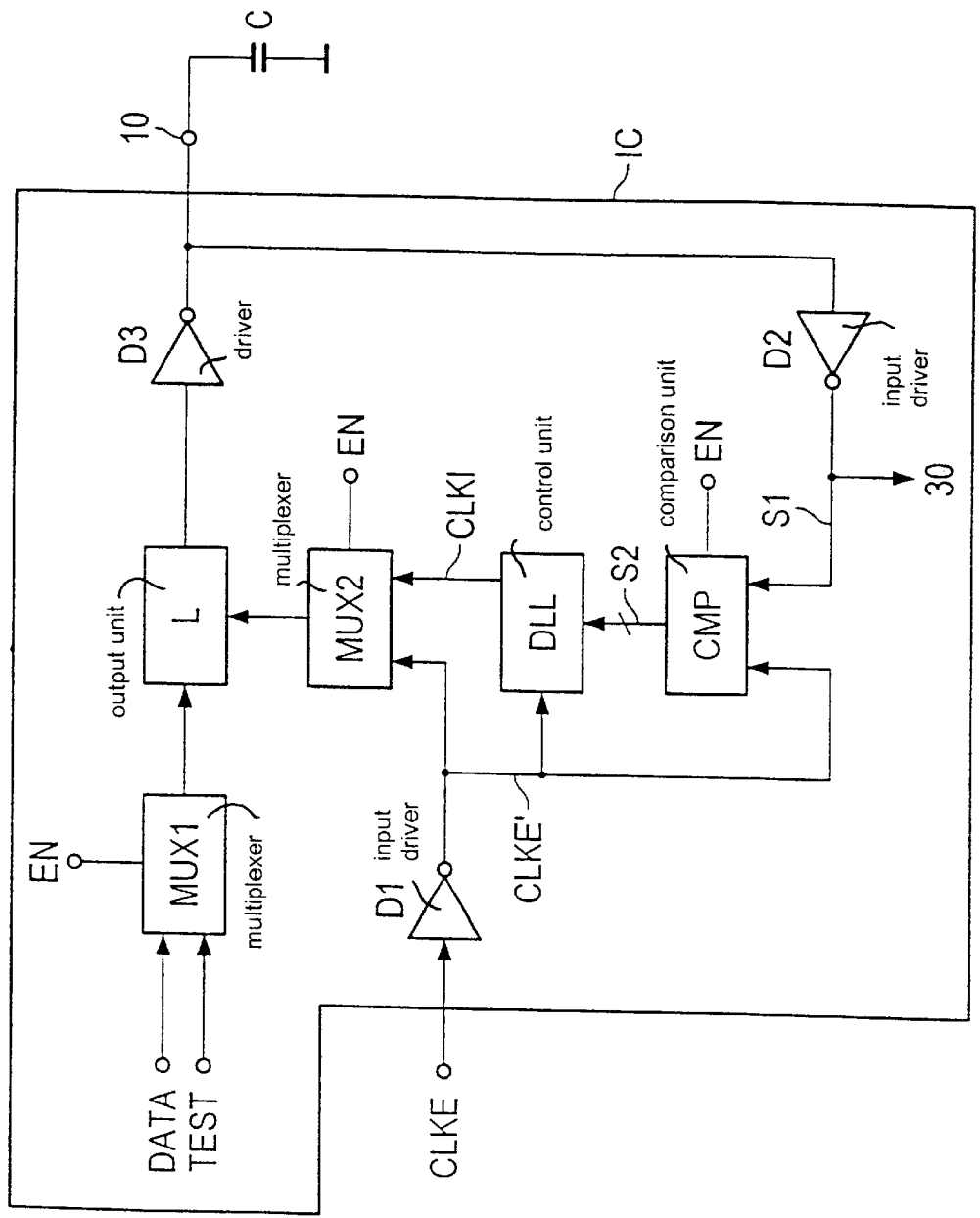
FIG. 1 is a schematic and block diagram showing a first exemplary embodiment of the integrated circuit outputting data at the data output with improved synchronism in relation to an external clock signal, irrespective of the external wiring of the circuit.

In all the figures of the drawing, sub-features and integral parts that correspond to one another bear the same reference symbol in each case.

Referring now to the figures of the drawings in detail and first, particularly to FIG. 1 thereof, there is shown a first preferred embodiment of the integrated circuit IC according to the invention in the form of an SDRAM. However, the invention is not restricted to SDRAMs, and also can be used in any other desired integrated circuits. The circuit has an output unit L. In a normal mode of operation of the integrated circuit IC, the output unit L outputs data DATA supplied to it via a first multiplexer MUX1 to a data output 10 of the integrated circuit. In this case, the data DATA are read out from memory cells (not illustrated) belonging to the SDRAM. The integrated circuit IC also has a clock input for the supply of an external clock signal CLKE. From the clock input, the external clock signal CLKE is supplied via a first input driver D1 to a DLL circuit (delay locked loop), which uses the external clock signal CLKE to generate an internal clock signal CLKI, which has a specific negative phase shift as compared with the external clock signal CLKE. The internal clock signal CLKI therefore leads the external clock signal CLKE. The internal clock signal CLKI is supplied to a clock input of the output unit L via a second multiplexer MUX2. The multiplexers MUX1, MUX2 are driven, via an activation signal EN, in such a way that, in a normal mode of operation of the circuit, the multiplexers MUX1, MUX2 supply the data DATA to the output unit L and supply the internal clock signal CLKI to the clock input of the output unit L.

In order to synchronize the data DATA output by the output unit L at the data output 10 with the external clock signal CLKE, the control unit DLL effects a negative phase shift of the internal clock signal CLKI with respect to the external clock signal CLKE such that the output unit L outputs the data DATA so early at the driver D3 that the data DATA are synchronized with the external clock signal CLKE at the data output 10, taking into account the signal propagation time of said data between the output unit L and the data output 10. However, the propagation time between the output unit L and the data output 10 depends on the external capacitive loading on the data output 10. The capacitive load is indicated in FIG. 1 by a capacitor C. The invention then provides for the phase shift of the internal clock signal CLKI, effected by the DLL, by comparison with the external clock signal CLKE, to be carried out on the basis of the capacitive load C on the data output 10. For this purpose, the two multiplexers MUX1, MUX2 are switched by the activation signal EN into a test mode of operation in such a way that the output unit L is supplied with a test signal TEST instead of the data DATA, and the external clock signal CLKE is supplied to its clock input instead of the internal clock signal CLKI. The test signal TEST is then transmitted to the data output 10 via the driver D3 by the output unit L on the basis of the external clock signal CLKE.

In order to determine the propagation time of the test signal TEST from the output unit L to the data output 10 (the propagation time being a measure of the capacitive load C on the data output 10), the integrated circuit IC has a comparison unit CMP, which determines the phase difference between the external clock signal CLKE and the test signal TEST output at the data output 10. For this purpose, the comparison unit CMP is supplied with the external clock signal CLKE at a first comparison input and, at a second comparison input, is supplied, via a second input driver D2, with the test signal output at the data output 10.

The comparison unit CMP is likewise controlled by the activation signal EN, which fixes the mode of operation of the integrated circuit. The comparison unit is activated only in the test mode of operation of the circuit, and is deactivated in the normal mode of operation. In the present exemplary embodiment, the test mode of operation is carried out during an initiation phase of the SDRAM. In the test mode of operation, the comparison unit CMP determines the propagation time of the test signal between output unit L and data output 10. In the normal mode of operation, the output unit L is then controlled by the internal clock signal CLKI which, by comparison with the external clock signal CLKE, has the (negative) phase shift that was determined in the test mode of operation and that, for this purpose, is stored by the comparison unit during the test mode of operation.

FIG. 1 also reveals that, in the normal mode of operation, the second input driver D2 also supplies data that is applied externally to the data output 10 and that is to be stored in the SDRAM (illustrated in FIG. 1 by the reference symbol 30).

In the test mode of operation, the second input driver D2 is therefore used to supply the test signal at the data output 10 to the comparison unit CMP and, in the normal mode of operation, to supply data which is applied externally to the data output 10 and which is to be stored in the memory. The data output 10 is therefore at the same time a data input to the SDRAM.

Figure 2:
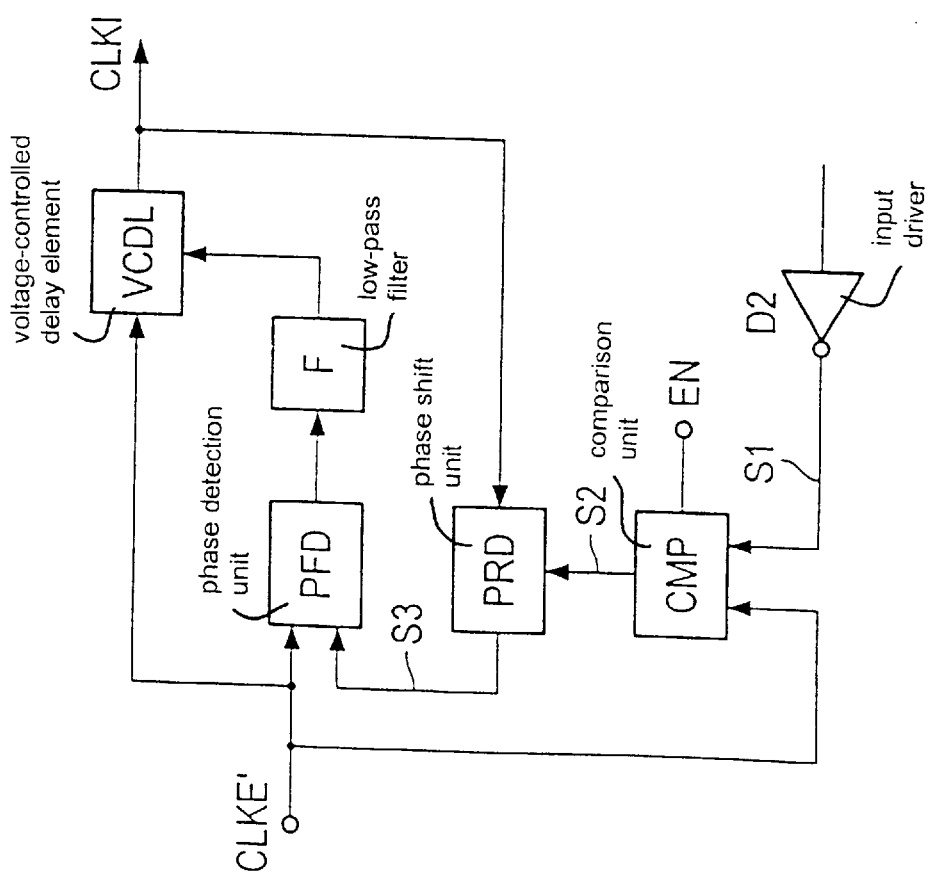
FIG. 2 is a diagram showing a detail of the exemplary embodiment from FIG. 1.

FIG. 2 reveals a block circuit diagram of the DLL illustrated in FIG. 1. The external clock signal CLKE' supplied by the clock input via the first input driver D1 is supplied to a voltage-controlled delay element VCDL (Voltage Control Delay Line), which uses it to generate the internal clock signal CLKI. At the same time, the external clock signal CLKE' is supplied to a first input of a phase detection unit PFD (phase frequency detect). A second input of the phase detection unit PFD is supplied with the output signal S3 from an adjustable phase shift unit PRD. The output signal from the phase detection unit PFD is supplied to the voltage-controlled delay unit VCDL as a control signal, via a low-pass filter F. The internal clock signal CLKI is fed back to the second input of the phase detection unit PFD, as the signal S3, via the adjustable phase shift unit PRD.

The phase shift unit PRD shifts the phase of the signal S3 at its output with respect to the internal clock signal CLKI. The phase shift depends on the detector signal S2 supplied to the phase shift unit PRD by a comparison unit CMP. The detector signal S2 is generated by the comparison unit CMP in the test mode of operation by comparing the external clock signal CLKE' and the test signal TEST at the data output 10, supplied to it in the form of a signal S1 via the second input driver D2. The exact functioning of the comparison unit CMP and of the phase shift unit PRD will be explained in the following text with reference to FIG. 4.

Figure 4:
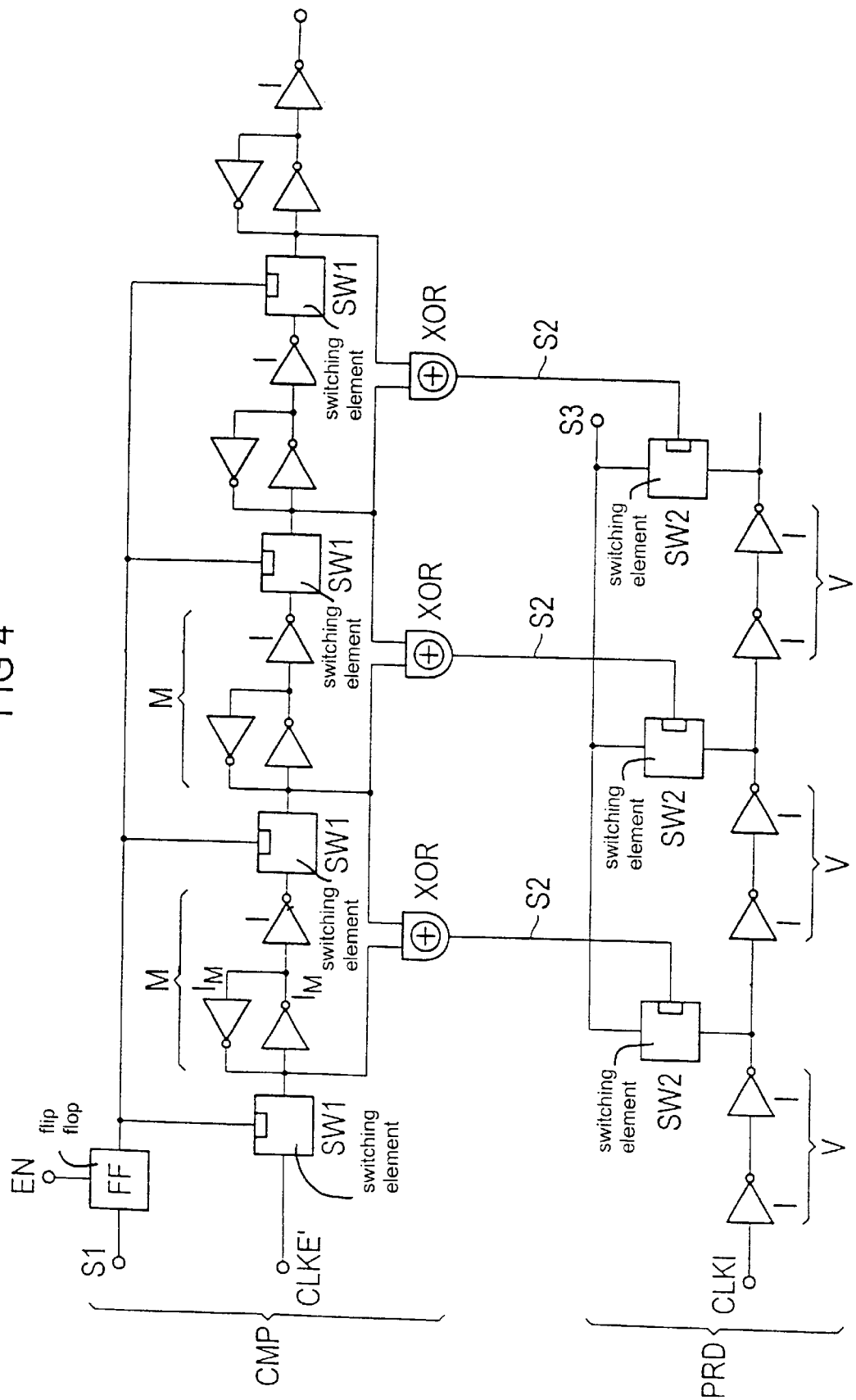
FIG. 4 is a diagram showing a detail of the block circuit diagram of FIG. 2.

FIG. 4 shows, in its upper part, the comparison unit CMP and, in its lower part, the phase shift unit PRD. The comparison unit CMP has a series circuit of a number of basic units, of which only four are shown in FIG. 4. Each basic unit includes a series circuit of a first switching element SW1 and a storage element M. The storage elements M have two inverters $I_M$, arranged in antiparallel, as a hold circuit, and also an inverter I which is connected downstream of the first inverter $I_M$, so that a signal level present on the input of each basic element is stored by the hold circuit and is inverted again by the downstream inverter I. This configuration also presents the original signal level in noninverted form at the output of the basic unit. Each two of the basic units are assigned an XOR gate, to which the signal levels stored by the corresponding storage elements M are supplied. The output signals from the XOR gates form the output signal S2 of the comparison unit CMP. The first switching units SW1 have control inputs to which the test signal S1 output at the data output 10 and tapped off there is supplied. The input of the series circuit of the basic units is supplied with the external clock signal CLKE'.

The functioning of the comparison unit CMP is as follows. Firstly, the basic elements are brought into a state in which all their storage units M store a low signal level. Then, in the test mode of operation, that edge of the external clock signal CLKE' with which the output of the test signal TEST by the output unit L from FIG. 1 is started, is transferred along the series circuit of the basic units by the switching units SW1, which are open at this time. This signal edge runs through the series circuit until the signal S1 at the data output 10 likewise exhibits a change of level. If the signal S1 exhibits a change of level, the first switching elements SW1 are blocked, so that the state of the storage units M is frozen. The signal S1 is supplied to the control inputs of the first switching elements SW1 via a flip-flop FF, which is reset via the activation signal EN. This is done when the integrated circuit is switched into the test mode of operation. The flip-flop FF is then set by the signal Si and thus stores the signal change which has occurred, so that the first switching elements SW1 remain permanently blocked, to be specific even after the integrated circuit IC has been switched to the normal mode of operation.

In the following text, the phase shift unit PRD will be explained with reference to FIG. 4. The internal clock signal CLKI is supplied to a series circuit of delay elements V, which each have two inverters I connected in series. The output of each delay element V is connected, via a second switching element SW2, to the output of the phase shift unit PRD, at which the latter supplies the signal S3. The second switching elements SW2 have control inputs to each of which one of the output signals S2 from the comparison unit CMP are supplied.

At the time at which the switching elements SW1 are blocked, the storage state of the storage elements M is "frozen". The signal edge of the external clock signal CLKE' therefore runs through the series circuit only until this time. The storage state is changed only in those storage elements M through which the signal edge could propagate until the aforementioned time. Subsequently, in the series circuit of the basic units, all the adjacent basic elements exhibit the same stored signal level, with the exception of the two basic elements as far as which the signal edge of the external clock signal CLKE' was just transferred before the first switching elements SW1 were blocked. For this reason, only that XOR gate which is connected to these two basic elements supplies a high signal level at its output. The remaining XOR gates output a low signal level. The comparison unit CMP therefore supplies an output signal S2 which is a measure of the propagation time shift or the phase difference between the external clock signal CLKE' and the signal S1, which has been derived from the test signal output at the data output 10.

In the phase shift unit PRD, it is precisely that second switching element SW2 that is switched on whose associated XOR gate supplies a high output level. All the other second switching elements SW2 remain blocked. The result is a delay of the output signal S3 from the phase shift unit PRD with respect to the internal clock signal CLKI that is proportional to the propagation time shift between the signal S1 and the external clock signal CLKE'. In other words, the phase shift resulting from the phase shift unit is set on the basis of the propagation time of the test signal and therefore on the basis of the capacitive load on the data output.

Figure 3:
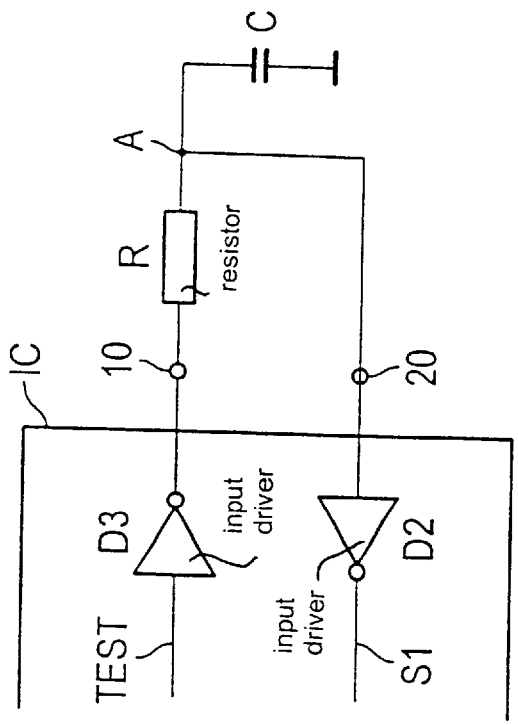
FIG. 3 is a diagram showing a detail of an embodiment of the invention which is an alternative to FIG. 1.

FIG. 3 shows a variant of the exemplary embodiment of FIG. 1, which differs from the latter only with regard to the detection of the test signal at the data output 10. While in FIG. 1 the signal at the data output 10 is tapped within the integrated circuit and supplied to the comparison unit CMP, in the exemplary embodiment according to FIG. 3, this is done by picking said signal off outside the integrated circuit. According to FIG. 3, the integrated circuit IC has, in addition to the data output 10, a data input 20 connected to the second input driver D2. The data output 10 is connected externally, via a resistor R, to the capacitive load C. Depending on the application, provision may be made for the external connection of the integrated circuit IC to provide a connection via such a resistance element R. The data input 20 is connected to a circuit junction A between the resistance element R and the capacitive load C. The comparison unit CMP is therefore supplied with the signal S1, which corresponds to the test signal TEST output at the data output 10, from outside the integrated circuit IC. This achieves the situation where the signal that is established at the circuit junction A is synchronized with the external clock signal CLKE.

I claim:

1. An integrated circuit, comprising:
   a clock input for an external clock signal, said clock input having a clock output unit controlled by an internal clock signal, said clock output unit outputting data to a data output during a normal mode of operation;
   a control unit generating the internal clock signal from the external clock signal, the internal clock signal having a specific phase shift with respect to the external clock signal, said control unit including an adjustable phase shift unit outputting a phase shift unit output signal, said adjustable phase shift unit setting a specific phase shift of the phase shift unit output signal during a test mode of operation;
   a detector unit having a detector output unit and a comparison unit, said detector unit determining a capacitive load on a data output in the test mode of operation and supplying said phase shift unit with a corresponding detector signal with which said phase shift unit sets the specific phase shift, said detector output unit outputting a test signal to the data output in the test mode of operation, said comparison unit having a first comparison unit input and a second comparison unit input determining a phase shift between the external clock signal and the test signal established at the data output in the test mode of operation;
   a first input driver having a first input driver input and a first input driver output, said first input driver supplying the external clock signal, said first input driver input connecting to said clock input and said first input driver output connecting to said first comparison unit input of said comparison unit and to a clock input of said output unit, said first input driver defining a propagation time of the external clock signal through said first input driver;

a second input driver having a second input driver input and a second input driver output, said second input driver input being supplied with the test signal established at said data output in the test mode of operation, and said second input driver output connecting to said second comparison unit input of said comparison unit, said second input driver having a propagation time of the test signal through said second input driver, said second input driver supplying data to be applied externally to the integrated circuit during the normal mode of operation; and the propagation time of the external clock signal through the first input driver and the propagation time of the test signal through the second input driver being essentially identical.

2. The integrated circuit according to claim 1, wherein said output unit is controlled by the external clock signal in the test mode of operation, and said control unit sets the phase shift unit so that the specific phase shift essentially equals the phase shift determined by the comparison unit.

3. The integrated circuit according to claim 1 further comprising:

a voltage controlled delay element generating the internal clock signal from the external clock signal; and a phase detector unit controlling said voltage controlled delay element having a first phase detector unit input and a second phase detector unit input, said first phase detector unit input receiving the external clock signal, said second phase detector unit input receiving an output signal from said phase shift unit, said phase shift unit receiving the internal clock signal, and said phase shift unit effecting a phase shift in the phase shift unit output signal with respect to the internal clock signal based on the detector signal.

* * * * *